(12) United States Patent
Luan

(10) Patent No.: US 10,244,638 B2
(45) Date of Patent: Mar. 26, 2019

(54) PROXIMITY SENSOR AND MANUFACTURING METHOD THEREFOR

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 166 days.

(21) Appl. No.: 14/981,185

(22) Filed: Dec. 28, 2015

(65) Prior Publication Data

US 2017/0052040 A1     Feb. 23, 2017

(30) Foreign Application Priority Data

Aug. 21, 2015   (CN) .......................... 2015 1 0519136

(51) Int. Cl.
| | |
|---|---|
| H05K 1/18 | (2006.01) |
| H05K 3/32 | (2006.01) |
| H05K 3/28 | (2006.01) |
| H05K 3/30 | (2006.01) |

(52) U.S. Cl.
CPC .............. *H05K 3/32* (2013.01); *H05K 1/181* (2013.01); *H05K 3/284* (2013.01); *H05K 3/303* (2013.01); *H01L 2224/73265* (2013.01); *H01L 2924/181* (2013.01); *H05K 2201/10121* (2013.01); *H05K 2201/10151* (2013.01)

(58) Field of Classification Search
CPC ............. H01L 25/167; H01L 2924/181; G01S 17/026
See application file for complete search history.

(56) References Cited

U.S. PATENT DOCUMENTS

| | | | |
|---|---|---|---|
| 9,645,238 B1 | 5/2017 | Luan | |
| 9,768,341 B2 | 9/2017 | Luan | |
| 2004/0238726 A1 | 12/2004 | Caldwell | |
| 2006/0016970 A1 | 1/2006 | Nagasaka et al. | |
| 2006/0079018 A1 | 4/2006 | Hurt et al. | |
| 2007/0018123 A1* | 1/2007 | Sano | G01V 8/12 250/551 |
| 2007/0210267 A1* | 9/2007 | Ishii | G01S 17/48 250/559.36 |

(Continued)

FOREIGN PATENT DOCUMENTS

| | | |
|---|---|---|
| CN | 102096464 A | 6/2011 |
| CN | 104272474 A | 1/2015 |
| CN | 104332524 A | 2/2015 |

OTHER PUBLICATIONS

U.S. Appl. No. 14/982,518, filed Dec. 29, 2015, Proximity Sensor, Electronic Apparatus and Method for Manufacturing Proximity Sensor.

*Primary Examiner* — Thanh Luu
(74) *Attorney, Agent, or Firm* — Seed Intellectual Property Law Group LLP

(57) ABSTRACT

A proximity sensor is provided according to the embodiments of the present disclosure, comprising: a sensor chip; a light-emitting device; a substrate, the sensor chip and the light-emitting device being located on the substrate; a transparent molding material covering a light-emitting surface of the light-emitting device; and a non-transparent molding material separating the transparent molding material from the sensor chip.

14 Claims, 6 Drawing Sheets

(56) References Cited

U.S. PATENT DOCUMENTS

| | | | |
|---|---|---|---|
| 2008/0006762 A1* | 1/2008 | Fadell | G01J 1/4204 |
| | | | 250/201.1 |
| 2010/0044722 A1 | 2/2010 | Lai et al. | |
| 2011/0141486 A1* | 6/2011 | Wada | G06F 3/011 |
| | | | 356/614 |
| 2012/0132793 A1 | 5/2012 | Campbell et al. | |
| 2012/0248625 A1 | 10/2012 | Coffy et al. | |
| 2013/0079068 A1* | 3/2013 | Coffy | H01L 25/167 |
| | | | 455/575.1 |
| 2013/0153772 A1 | 6/2013 | Rossi et al. | |
| 2013/0248887 A1 | 9/2013 | Coffy et al. | |
| 2013/0292553 A1* | 11/2013 | Chang | G01J 1/04 |
| | | | 250/216 |
| 2014/0091326 A1 | 4/2014 | Tran et al. | |
| 2014/0374776 A1* | 12/2014 | Nakasuji | H01L 25/167 |
| | | | 257/82 |
| 2015/0137148 A1 | 5/2015 | Wong | |
| 2016/0025855 A1* | 1/2016 | Camarri | G01S 7/4816 |
| | | | 250/206.1 |
| 2016/0043054 A1 | 2/2016 | Fischer et al. | |
| 2016/0141440 A1 | 5/2016 | Chun et al. | |
| 2016/0187483 A1 | 6/2016 | Luan et al. | |
| 2016/0190380 A1 | 6/2016 | Luan | |
| 2017/0123064 A1 | 5/2017 | Luan | |
| 2017/0123101 A1 | 5/2017 | Luan | |

* cited by examiner

PROXIMITY SENSOR AND MANUFACTURING METHOD THEREFOR

BACKGROUND

Technical Field

The embodiments of the present disclosure relate to the technical field of semiconductors, and more particularly, to a proximity sensor and a manufacturing method therefor.

Description of the Related Art

A proximity light sensor typically (e.g., as compared to an image sensor of a camera module) comprises a relatively small number (e.g., a 10×10 array) of exposed light sensitive pixels for providing an indication of an ambient light level. Only a small number of pixels are required because it is not necessary for ambient light sensors to be capable of capturing a sharp image. The proximity light sensors are used in many applications, including mobile communications apparatuses (such as mobile phones and PDAs), laptops, desktop computers, network cameras and the like.

Proximity sensors typically comprise a radiation source and a corresponding detector, the detector also comprising a relatively small number of exposed light sensitive pixels. Proximity sensing is implemented by: emitting light from the radiation source; capturing light reflected back to the detector by an object; and processing the reflected light to determine the proximity of the object. Proximity sensors are also used in many applications, including mobile communications devices and vehicle parking sensors.

The radiation source and the detector of a typical proximity sensor are generally located on the same substrate and provided in different cavities, the different cavities being implemented by a light-impermeable cap placed on the substrate.

However, there is a need to further reduce the manufacturing cost of the proximity sensor.

BRIEF SUMMARY

One or more of the embodiments of the present disclosure are directed to providing a new proximity sensor and a manufacturing method therefor.

According to one aspect of the present disclosure, a proximity sensor is provided, comprising: a sensor chip; a light-emitting device; a substrate, the sensor chip and the light-emitting device being located on the substrate; a transparent molding material covering a light-emitting surface of the light-emitting device; and a non-transparent molding material separating the transparent molding material from the sensor chip.

Optionally, the light-emitting device on the substrate is sealed by the transparent molding material.

Optionally, the sensor chip is attached to the substrate by means of an insulative attachment material, and the light-emitting device is attached to the substrate by means of a conductive attachment material.

Optionally, the proximity sensor further comprises a filtering component located right above a sensor region of the sensor chip.

Optionally, the transparent molding material also covers a sensor region of the sensor chip.

Optionally, the non-transparent molding material partially covers a surface of the sensor chip which has a sensor region, such that the sensor region is not covered by the non-transparent molding material.

Optionally, the non-transparent molding material partially covers the transparent molding material, such that a light emergent path of the light-emitting device is not covered by the non-transparent molding material.

According to another aspect of the present disclosure, an electronic apparatus is provided, comprising the proximity sensor according to any one of the above.

According to a further aspect of the present disclosure, a method for manufacturing a proximity sensor is provided, comprising: providing a substrate; providing a light-emitting device on the substrate, and electrically coupling the light-emitting device to the substrate; covering a light-emitting surface of the light-emitting device using a transparent molding material; providing a sensor chip on the substrate, and electrically coupling the sensor chip to the substrate; and separating the transparent molding material from the sensor chip using a non-transparent molding material.

Optionally, covering a light-emitting surface of the light-emitting device using a transparent molding material comprises: sealing the light-emitting device on the substrate using the transparent molding material.

Optionally, the sensor chip is attached to the substrate using an insulative attachment material, and the light-emitting device is attached to the substrate using a conductive attachment material.

Optionally, the method further comprises: providing a filtering component right above a sensor region of the sensor chip.

Optionally, the transparent molding material also covers a sensor region of the sensor chip.

Optionally, the method further comprises: partially covering a surface of the sensor chip which has a sensor region using the non-transparent molding material, such that the sensor region is not covered by the non-transparent molding material.

Optionally, the method further comprises: partially covering the transparent molding material using the non-transparent molding material, such that a light emergent path of the light-emitting device is not covered by the non-transparent molding material.

Optionally, the method further comprises: after covering by means of the non-transparent molding material, performing singulation processing.

By using the manufacturing method according to the embodiments of the present disclosure, a proximity sensor with a lowered cost can be obtained.

BRIEF DESCRIPTION OF THE SEVERAL VIEWS OF THE DRAWINGS

The embodiments of the invention will now be described by way of example only with reference to the drawings, in which.

DETAILED DESCRIPTION

In the following description, certain particular details are set forth in order to provide a thorough understanding of various aspects of the disclosed subject matter. However, the disclosed subject matter can also be implemented without these particular details.

Unless otherwise required in the context, the term "comprise" appearing in the whole text of the description and the appended claims will be interpreted as open inclusion, i.e., interpreted as "including, but not limited to."

Reference by means of this description to "one embodiment," or "an embodiment" means that a specific feature, structure or characteristic described in connection with the embodiment is included in at least one embodiment. Therefore, the expressions "in one embodiment" or "in an embodiment" appearing in various parts by means of the whole text of the present description do not necessarily refer to the same aspect. Furthermore, the specific features, structures, or characteristics can be combined in any suitable manner in one or more aspects of the present disclosure.

Figure 1:
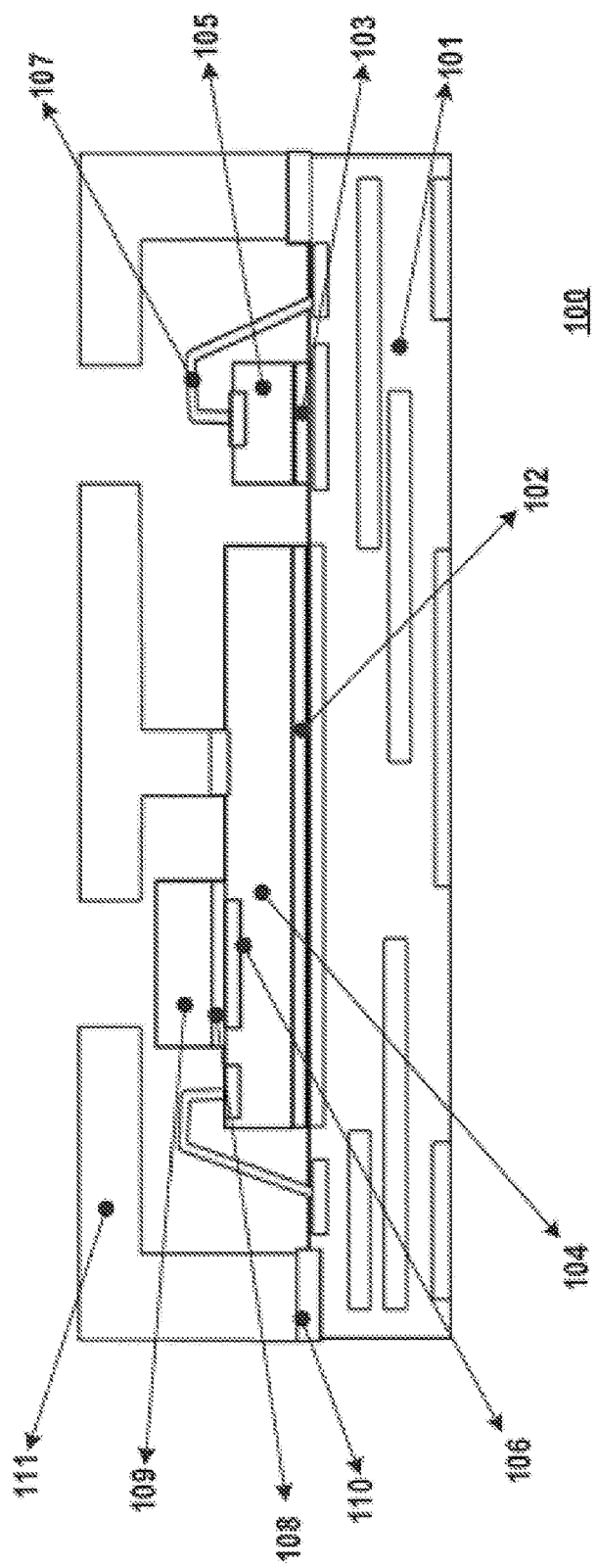
FIG. 1 is a schematic diagram of an existing proximity sensor.

As shown in FIG. 1, a proximity sensor 100 in FIG. 1 comprises a sensor die 104 and a light-emitting device 105 which are located on a substrate 101, wherein the sensor die 104 is attached to the substrate by means of a sensor die attachment material 102, and the light-emitting device 105 is attached to the substrate 101 by means of a conductive attachment material 103. The sensor die 104 is made of a semiconductor material, such as silicon, as is well known in the art.

The substrate 101 may be a silicon substrate, a printed circuit board, ceramic, metal, or a die, and the like. The sensor die attachment material 102 may be an adhesive, and the like. The conductive attachment material 103 may be solder, a conductive glue, and the like. The sensor die 104 has, on its upper surface, a sensor region 106 for receiving light which is emitted by the light-emitting device 105 and reflected back. In the sensor die 104, a sensor circuit is buried in the vicinity of the sensor region 106 so as to process a current to which the light received by the sensor region 106 is converted. The light-emitting device 105 may be an infrared radiation light-emitting device, a laser, a light-emitting diode, or a vertical cavity surface emitting laser (VCSEL), and the like. Those skilled in the art will appreciate that, in order to avoid the situation where the light emitted from the light-emitting device 105 directly shines onto the sensor region 106, it is necessary that the sensor region 106 and the light-emitting device 105 are spaced apart using a light-impermeable component. In the example of FIG. 1, the sensor region 106 and the light-emitting device 105 are spaced apart using a non-transparent cap 111. As shown in FIG. 1, the cap 111 is attached to the substrate 101 and the sensor die 104 by using a cap attachment glue 110, such that two spaced-apart cavities are formed on the substrate 101, wherein the light-emitting device 105 and the sensor region 106 are respectively provided in the two cavities. In order to protect the sensor region 106 and improve the efficiency of the sensor die, glass, or glass having a filtering coating 109 can generally be provided on the sensor region 106 which receives the reflected light, wherein the glass or the glass having the filtering coating 109 is fixed above the sensor region 106 by means of a transparent adhesive or adhesive-glue 108. In the example of FIG. 1, the light-emitting device 105 has a bond pad on an upper surface thereof, wherein the bond pad is bonded to a bond pad on an upper surface of the substrate 101 via a wire 107, such that electrical signals are transmitted between the light-emitting device 105 and the substrate 101. Similarly, the sensor die 104 also has a bond pad on the upper surface thereof, wherein the bond pad is bonded to a bond pad on the upper surface of the substrate 101 via a wire, such that electrical signals are transmitted between the sensor die 104 and the substrate 101.

However, the conventional proximity sensors mentioned above exhibit some problems, for example, since the cap is made from materials such as gum, metal or ceramic, and steps such as aligning the glue coating and joining are specified in the manufacturing process, the manufacturing cost thereof is high. In addition, since the cavities are not sealed, dust, etc., may be introduced in a subsequent assembly or use process, which can result in proximity sensor detection faults.

For this reason, the present disclosure proposes a proximity sensor of a new construction, which can solve at least some of the technical problems mentioned above, for example, reducing the manufacturing cost or reducing the probability of fault occurrence.

Figure 2:
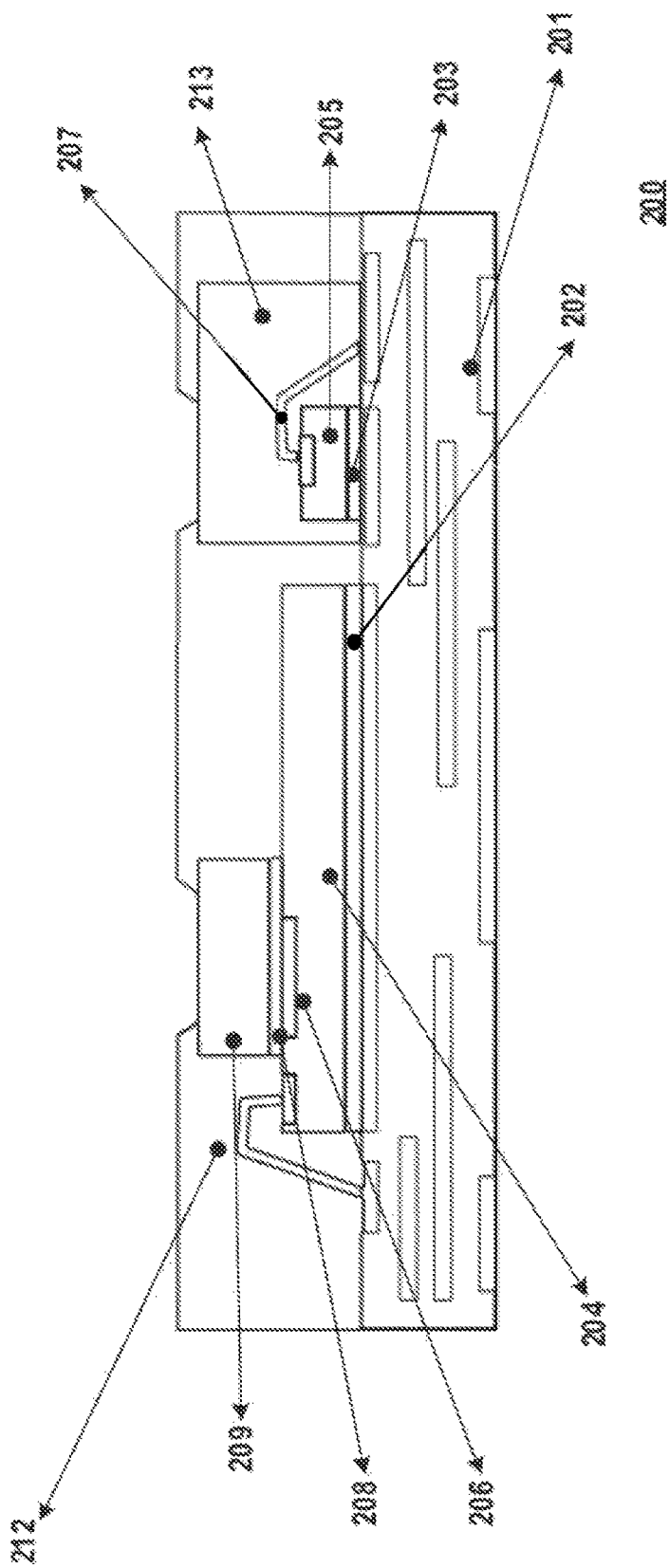
FIG. 2 is a schematic diagram of a proximity sensor according to one embodiment of the present disclosure.

Reference is made to FIG. 2 which shows a proximity sensor according to one embodiment of the present disclosure. Like references refer to like components in FIG. 2 and FIG. 1 but are referred to in the 200 number series in FIG. 2 and will not be described herein again in the interest of brevity. In the example of FIG. 2, a proximity sensor 200 comprises a sensor die 204 and a light-emitting device 205 on a substrate 201, wherein the sensor die 204 is attached to the substrate by means of a sensor die attachment material 202, and the light-emitting device 205 is attached to the substrate 201 by means of a conductive attachment material 203. In the example of FIG. 2, the sensor die attachment material 202 is nonconductive, and the attachment material 203 is conductive. Those skilled in the art will appreciate that, in other examples, the sensor die attachment material 202 can be conductive and the attachment material 203 can be nonconductive. Similar to the substrate 101, the substrate 201 may be a silicon substrate, a printed circuit board, ceramic, metal or a die and the like, in which a circuit can be provided and which can be electrically coupled to the sensor die 204 and the light-emitting device 205.

The sensor die attachment material 202 may be an adhesive, and the like. The conductive attachment material 203 may be solder, a conductive glue, and the like. The sensor die 204 has, on its upper surface, a sensor region 206 for receiving light which is emitted by the light-emitting device 205 and reflected back. In the sensor die 204, a sensor circuit is buried in the vicinity of the sensor region 206 so as to process a current to which the light received by the sensor region 206 is converted. The light-emitting device 205 may be an infrared radiation light-emitting device, a laser, a light-emitting diode, or a vertical cavity surface emitting laser (VCSEL), and the like. In the sensor region 206, glass having a filtering coating 209 is adhered to the sensor die 204 using a transparent adhesive-glue 208. Those skilled in the art will appreciate that the configuration in FIG. 2 is an example only, glass without a filtering coating or a transparent molding material, such as resin, can be used to cover the sensor region 206 instead of using the glass having a filtering coating. In the case where transparent resin is used to cover the sensor region 206, the transparent glue adhesive 208 may also not be used. In another example, no transparent material need be provided above the sensor region 208.

In addition, in the example of FIG. 2, on the light-emitting device 205, a transparent molding material 213 is used to seal the light-emitting device 205. Those skilled in the art will appreciate that the transparent molding material 213 can be located only right above the light-emitting device 205 so as to cover an upper surface of the light-emitting device 205. The transparent molding material 213 can be transparent polymer, e.g., epoxy resin, and the like. Those skilled in the art will appreciate that other transparent molding materials can also be used. Those skilled in the art will also appreciate that there is no transparent molding material on the light-emitting device 205.

Those skilled in the art will appreciate that, in order to avoid the situation where the light emitted from the light-emitting device 205 directly shines onto the sensor region 206, the sensor region 206 and the light-emitting device 205 are spaced apart using a light-impermeable component. In the example of FIG. 2, the sensor region 206 and the light-emitting device 205 are spaced apart using a non-transparent molding material 212. The non-transparent molding material 212 may be a polymer, and the like. In the example of FIG. 2, it can be seen that the non-transparent molding material 212 partially covers a surface of the sensor die 204 which has the sensor region 206, such that the sensor region 206 is not covered by the non-transparent molding material 212. In addition, the non-transparent molding material 212 also partially covers the transparent molding material 213, such that a light emergent path of the light-emitting device 205 is not covered by the non-transparent molding material 212. In the example of FIG. 2, the non-transparent molding material 212 can be formed by means of one-step molding.

In the example of FIG. 2, the non-transparent molding material 212 fully fills a region between the transparent molding material 213, and the glass 209 and sensor die 204. Those skilled in the art will appreciate that the non-transparent molding material can also fill only a space right above a region on the substrate 201 between the die 204 and the transparent molding material 213, or fill only a part of the space, as long as light emitted from the light-emitting device 205 cannot be directly incident on or be reflected in the proximity sensor to the sensor region 206. In other words, the transparent molding material 213 and the sensor chip 204 are spaced apart by the non-transparent molding material 212. Those skilled in the art will appreciate that it is also possible to have other structure configurations, such that the transparent molding material 213 and the sensor chip 204 are spaced apart by the non-transparent molding material 212.

In the example of FIG. 2, the light-emitting device 205 has a bond pad on the upper surface thereof, wherein the bond pad is bonded to a bond pad on an upper surface of the substrate 201 via a wire 207, such that electrical signals are transmitted between the light-emitting device 205 and the substrate 201. Similarly, the sensor chip 204 also has a bond pad on the upper surface thereof, wherein the bond pad is bonded to a bond pad on the upper surface of the substrate 201 via a wire, such that electrical signals are transmitted between the sensor chip 204 and the substrate 201.

Figure 3A:
FIGS. 3A-3G are manufacturing flow charts of a proximity sensor according to one embodiment of the present disclosure.

A method for manufacturing a proximity sensor according to one embodiment of the present disclosure will be illustrated in combination with FIGS. 3A-3G. Reference is made to FIG. 3A, a substrate module in a matrix form is provided, which contains a plurality of substrates, for example, the substrate 101 in FIG. 1 or the substrate 201 in FIG. 2.

Figure 3B:
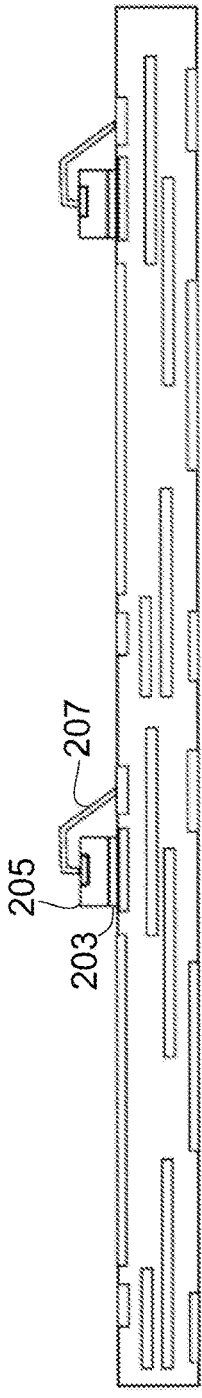

As shown in FIG. 3B, the substrates are coated with a plurality of conductive attachment materials, for example, the conductive attachment material 103 or 203 in FIG. 1 or 2. A light-emitting device is attached to the corresponding conductive attachment material 103 or 203, for example, the light-emitting device 105 or 205 in FIG. 1 or 2. A bond pad on the upper surface of the light-emitting device is bonded to a pad on the substrate by a wire 207 formed in a wire bonding process, such that electrical coupling is implemented between the light-emitting device and the substrate.

Figure 3C:
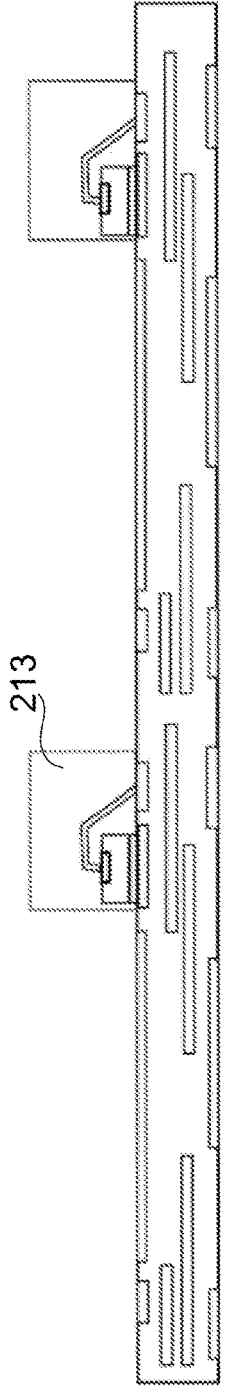

As shown in FIG. 3C, the light-emitting devices are molded using transparent polymer 213, such that the transparent molding material respectively encloses the light-emitting devices. The transparent molding material is for example the transparent molding material 213 shown in FIG. 2.

Figure 3D:
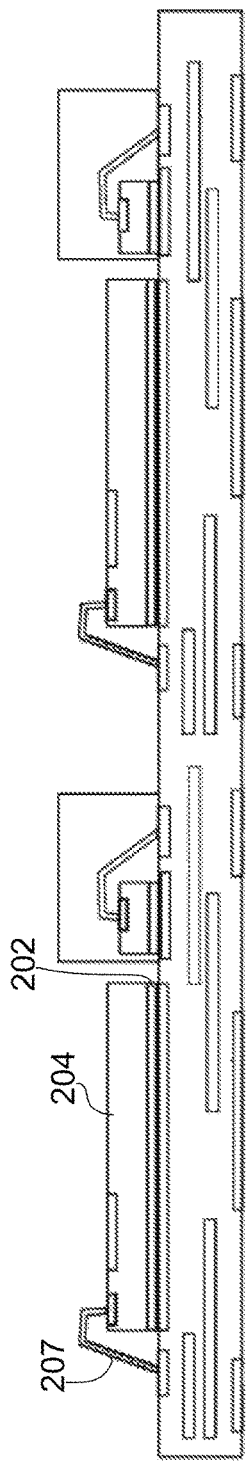

As shown in FIG. 3D, the substrates are coated with corresponding die attachment materials 202, and corresponding sensor dies are attached to the substrates. A bond pad on the upper surface of the sensor die is bonded to a pad on the substrate by wires 207 in the wire bonding process, such that electrical coupling is implemented between the sensor die and the substrate.

Figure 3E:
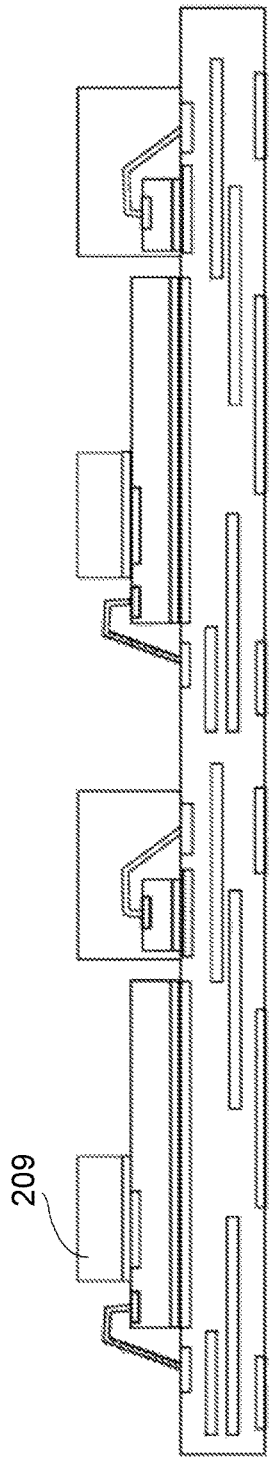

As shown in FIG. 3E, a transparent adhesive-glue (the adhesive-glue 208 as shown in FIG. 2) is applied above and around the sensor region of the sensor die, and glass coated with a filtering coating (the filtering glass 209 as shown in FIG. 2) is adhered on the transparent adhesive-glue.

Figure 3F:
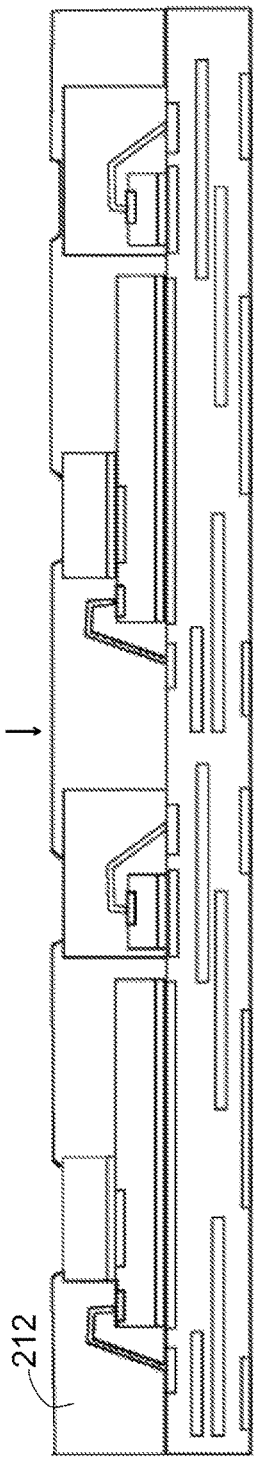
Figure 3G:
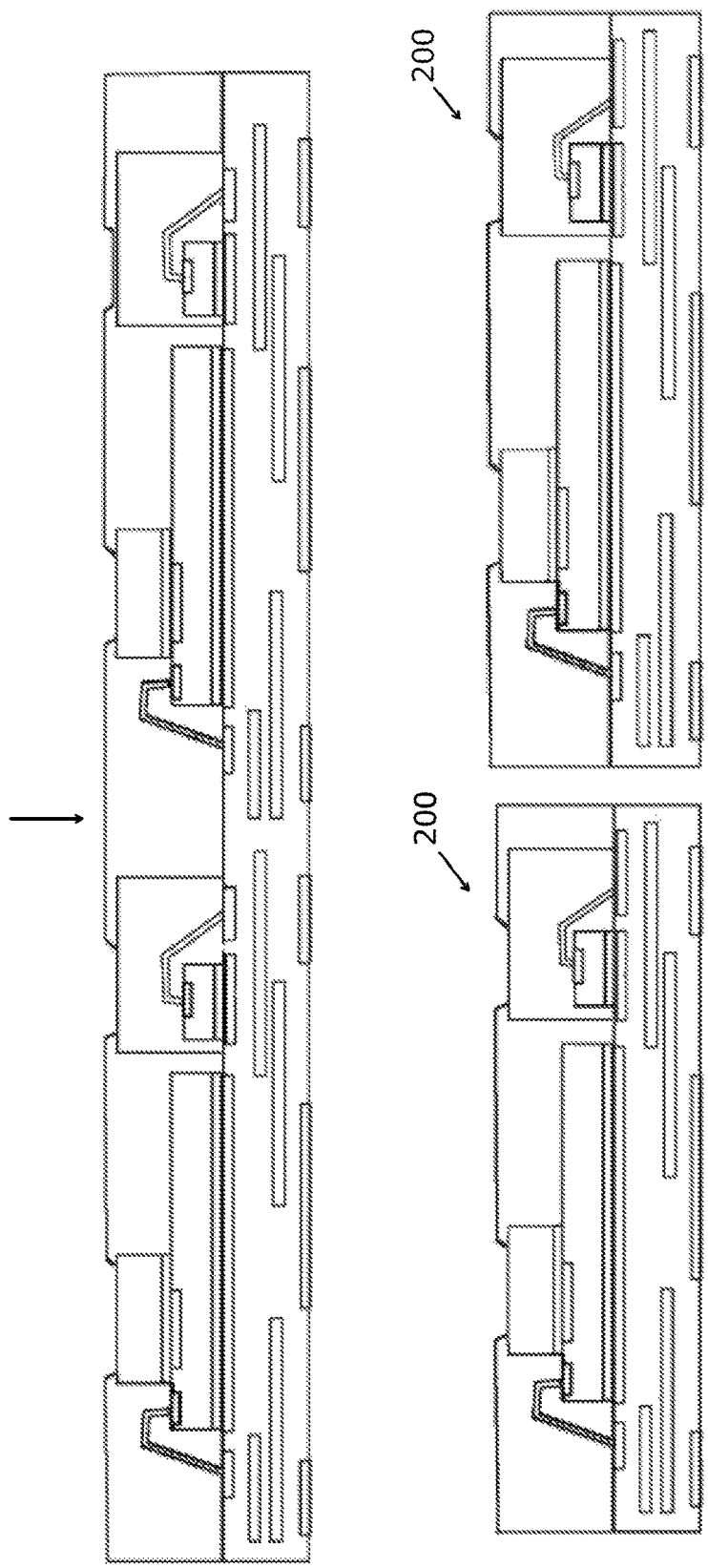

As shown in FIG. 3F, a non-transparent molding material is molded on the substrates, such as the non-transparent molding material 212 shown in FIG. 2.

As shown in FIG. 3F, a singulation process is performed, during which the proximity sensor modules in a matrix form are cut, such as at the arrow indicated, into single proximity sensors 200 as shown in FIG. 2G.

In summary, according to one aspect of the present disclosure, a proximity sensor is provided, comprising: a sensor chip; a light-emitting device; a substrate, the sensor chip and the light-emitting device being located on the substrate; a transparent molding material covering a light-emitting surface of the light-emitting device; and a non-transparent molding material separating the transparent molding material from the sensor chip.

Optionally, the light-emitting device on the substrate is sealed by the transparent molding material.

Optionally, the sensor chip is attached to the substrate by means of an insulative attachment material, and the light-emitting device is attached to the substrate by means of a conductive attachment material.

Optionally, the proximity sensor further comprises a filtering component located right above a sensor region of the sensor chip.

Optionally, the transparent molding material also covers the sensor region of the sensor chip.

Optionally, the non-transparent molding material partially covers a surface of the sensor chip which has the sensor region, such that the sensor region is not covered by the non-transparent molding material.

Optionally, the non-transparent molding material partially covers the transparent molding material, such that a light emergent path of the light-emitting device is not covered by the non-transparent molding material.

According to another aspect of the present disclosure, an electronic apparatus is provided, comprising the proximity sensor according to any one of the above.

According to a further aspect of the present disclosure, a method for manufacturing a proximity sensor is provided, comprising: providing a substrate; providing a light-emitting device on the substrate, and electrically coupling the light-emitting device to the substrate; covering a light-emitting surface of the light-emitting device using a transparent molding material; providing a sensor chip on the substrate, and electrically coupling the sensor chip to the substrate; and separating the transparent molding material from the sensor chip using a non-transparent molding material.

Optionally, covering a light-emitting surface of the light-emitting device using a transparent molding material comprises: sealing the light-emitting device on the substrate using the transparent molding material.

Optionally, the sensor chip is attached to the substrate using an insulative attachment material, and the light-emitting device is attached to the substrate using a conductive attachment material.

Optionally, the method further comprises: providing a filtering component right above a sensor region of the sensor chip.

Optionally, the transparent molding material also covers the sensor region of the sensor chip.

Optionally, the method further comprises: partially covering a surface of the sensor chip which has the sensor region using the non-transparent molding material, such that the sensor region is not covered by the non-transparent molding material.

Optionally, the method further comprises: partially covering the transparent molding material using the non-transparent molding material, such that a light emergent path of the light-emitting device is not covered by the non-transparent molding material.

Optionally, the method further comprises: after covering by means of the non-transparent molding material, performing singulation processing.

Optionally, the method further comprises: after covering by means of the non-transparent molding material, performing singulation processing.

By using the manufacturing method according to the embodiments of the present disclosure, a proximity sensor with a lowered cost can be obtained.

Figure 4:
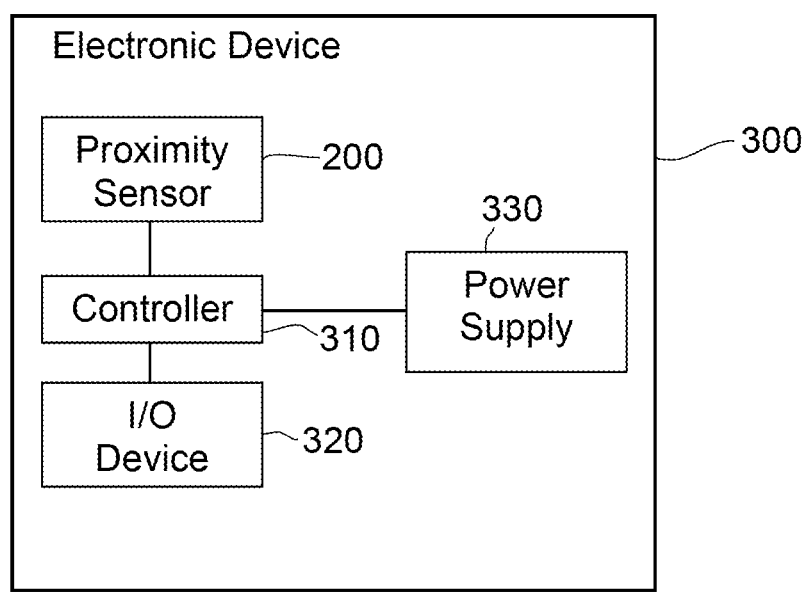
FIG. 4 is a block diagram of an electronic device according to one embodiment of the present disclosure.

FIG. 4 illustrates a block diagram of an electronic device that includes a proximity sensor, such as the proximity sensor 200 of FIG. 2. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 300 includes a controller 310 and a proximity sensor 200 that is electrically coupled to the controller. The controller 310 includes control circuitry, which may include one or more processors, memory, and discrete logic. The controller 310 is configured to transmit signal to and receive signals from the proximity sensor 200. The electronic device may further include an input/output device 320, for example, a keyboard or a display that is coupled to the controller. The electronic device may further include a power supply 330, which may be a battery or components for coupling to an external power source.

It should be noted that, even though several units or sub-units of the system are mentioned in the above detailed description, such a division is not mandatory. Indeed, according to the embodiments of the present disclosure, the features and functions of two or more units described above can be embodied in one unit. Conversely, the features and functions of one unit described above can be further divided and embodied in a plurality of units.

In addition, even though the operations of the method of the embodiments of the present disclosure are described in a specific order in the figures, this is not intended to require or imply that these operations must be executed in the specific order, or that the desired result can only be realized by executing all the operations shown. Instead, the execution order of the steps depicted in the flow charts can be changed. Additionally or alternatively, some steps can be omitted, a plurality of steps can be incorporated as one step for execution, and/or one step can be subdivided into a plurality of steps for execution.

Although the present invention has been described with reference to several particular embodiments, it should be appreciated that the present invention is not limited to the disclosed particular embodiments. The present invention intends to cover various modifications and equivalent arrangements within the spirit and scope of the appended claims. The scope of the appended claims conforms to the broadest interpretation, thereby including all such modifications and equivalent structures and functions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A proximity sensor, comprising:
   a substrate having a first surface;
   a sensor chip coupled to the first surface of the substrate, the sensor chip having a sensor region on a surface of the sensor chip;
   a layer of glass over the sensor region;
   a transparent adhesive coupling the layer of glass to the sensor region of the sensor chip;
   a light-emitting device coupled to the substrate by conductive wires, the light-emitting device having a light emitting surface;
   transparent molding material sealing the light-emitting device and the conductive wires; and
   non-transparent molding material on the surface of the sensor chip and not on the sensor region, the non-transparent molding material abutting a surface of the transparent molding material, a side surface of the layer of glass, and a side surface of the sensor chip, wherein the non-transparent molding material is on the substrate between the transparent molding material and the sensor chip.

2. The proximity sensor as claimed in claim 1, wherein the non-transparent molding material is on a perimeter of the transparent molding material.

3. The proximity sensor as claimed in claim 1, further comprising an insulative attachment material and a conductive attachment material, wherein the sensor chip is coupled to the substrate by the insulative attachment material, and the light-emitting device is coupled to the substrate by the conductive attachment material.

4. The proximity sensor as claimed in claim 1, wherein the sensor region is on a first surface of the sensor chip, the proximity sensor further comprising:
   a filtering component covering the sensor region of the sensor chip, the non-transparent molding material covering a remaining portion of the first surface.

5. The proximity sensor as claimed in claim 1, wherein the sensor region is on a first surface of the sensor chip.

6. The proximity sensor as claimed in claim 1, wherein a light emergent path of the light-emitting device is not covered by the non-transparent molding material.

7. An electronic apparatus, comprising:
a proximity sensor including:
   a substrate having a first surface;
   a sensor chip coupled to the first surface, the sensor chip including a sensor region on a surface of the sensor chip;
   a layer of glass over the sensor region;
   a transparent adhesive coupling the layer of glass to the sensor region of the sensor chip;
   a light-emitting device coupled to the first surface, the light-emitting device having a light emitting surface;
   transparent molding material sealing light-emitting device;
   non-transparent molding material on the surface of the sensor chip but not on the sensor region of the sensor chip, the non-transparent molding material located abutting a surface of the transparent molding material, a side surface of the layer of glass, and a side surface of the sensor chip; and
a controller coupled to the proximity sensor.

8. The electronic apparatus as claimed in claim 7, wherein the non-transparent molding material is between the transparent molding material.

9. The electronic apparatus as claimed in claim 7, further comprising conductive wires that electrically couple the sensor chip to the substrate.

10. The electronic apparatus as claimed in claim 7, wherein the electronic apparatus is at least one of a mobile phone, a personal digital assistant, a laptop, a desktop computer, a wearable device, a camera, and a video device.

11. A method for manufacturing a proximity sensor, comprising:
   coupling a light-emitting device to a surface of a substrate;
   electrically coupling the light-emitting device to the substrate by first conductive elements;
   in a first molding process, sealing the light-emitting device and the first conductive elements in a transparent molding material;
   coupling a sensor chip to the surface of the substrate, the sensor chip having a surface that includes a sensor region;
   electrically coupling the sensor chip to the substrate by second conductive elements;
   covering a sensor region of the sensor chip with a layer of glass, wherein a remaining portion of the surface remains uncovered from the layer of glass; and
   in a second molding process, molding a non-transparent molding material on the substrate and the remaining portion of the surface of the sensor chip such that the non-transparent molding material covers a portion of the transparent molding material and a portion of the layer of glass and is between the transparent molding material and the sensor chip so that the non-transparent molding material abuts a side surface of the sensor chip and abuts a side surface of the transparent molding material.

12. The method as claimed in claim 11, wherein:
coupling the sensor chip to the surface of the substrate comprises using an insulative attachment material to attach the sensor chip to the surface of the substrate, and
coupling the light-emitting device to the surface of the substrate comprises using a conductive attachment material to attach the light-emitting device to the surface of the substrate.

13. The method as claimed in claim 11, further comprising:
placing a filtering component over a sensor region of the sensor chip.

14. The method as claimed in claim 11, wherein:
coupling the light-emitting device comprises coupling a plurality of light-emitting devices to the surface of the substrate by first conductive elements;
electrically coupling the light-emitting device comprises electrically coupling the plurality of light-emitting devices to the surface of the substrate;
sealing the light-emitting surface comprises sealing light-emitting surfaces of the light-emitting devices with transparent molding material;
coupling the sensor chip comprises coupling a plurality of sensor chips to the surface of the substrate by second conductive elements;
electrically coupling the sensor chip comprises electrically coupling the plurality of sensor chips to the substrate; and
the method further comprising:
performing singulation processing to form individual packages.

* * * * *